United States Patent
Chen et al.

[11] Patent Number: 5,866,945
[45] Date of Patent: Feb. 2, 1999

[54] BORDERLESS VIAS WITH HSQ GAP FILLED PATTERNED METAL LAYERS

[75] Inventors: Robert C. Chen, Los Altos; Jeffrey A. Shields, Sunnyvale, both of Calif.; Robert Dawson, Austin, Tex.; Khanh Tran, San Jose, Calif.

[73] Assignee: Advanced Micro Devices, Sunnyvale, Calif.

[21] Appl. No.: 951,592

[22] Filed: Oct. 16, 1997

[51] Int. Cl.⁶ ............................ H01L 23/48; H01L 23/52
[52] U.S. Cl. .......................................... 257/750; 257/632
[58] Field of Search .................................. 257/632, 750

[56] References Cited

U.S. PATENT DOCUMENTS

| | | |
|---|---|---|
| 5,456,952 | 10/1995 | Garza et al. . |
| 5,506,177 | 4/1996 | Kishmoto et al. . |
| 5,530,293 | 6/1996 | Cohen . |
| 5,534,731 | 7/1996 | Cheung . |
| 5,549,934 | 8/1996 | Garza et al. . |
| 5,563,102 | 10/1996 | Michael . |
| 5,604,380 | 2/1997 | Nishimura et al. . |

OTHER PUBLICATIONS

A.J. Konecni et al., "A Stable Plasma Treated CVD Titanium Nitride Film for Barrier/Glue Layer Applications," pp. 181–183, Jun. 18–20, 1996, VMIC Conference, 1995 ISMIC.

Kim et al., "Stability of TiN Films Prepared by Chemical Vapor Depositon Using Tetrakis–dimethylamino Titanium," J. Electrochem. Soc., vol. 143, No. 9, Sep. 1996, pp. L188–L190.

J. Iacoponi et al., "Resistivity Enhancement of CVD TiN with In–Situ Nitrogen Plasma and its Applicatin in Low Resistance Multilevel Interconnects," Advanced Metalization and Interconnection Systems for ULSI Applications in 1995.

M. Eizenberg et al., "Chemical vapor depositon TiCN: A new barrier metallization for submicron via and contact applications," J. Vac. Sc. Technol. A 13(3), May/Jun. 1995, pp. 590–595.

M. Eizenberg et al., "TiCN: A new chemical vapor deposited contact barrier metallization for submicron devices," (3 pages).

J.T. Hillman et al., "Comparison of Titanium Nitride Barrier Layers Produced by Inorganic and Organic CVD," VMIC Conference, Jun. 9–10, 1992, pp. 246–252.

C.C. Liu et al., "Integrated HDP Technology for Sub–0.25 Micron Gap Fill," VMIC Conference, Jun. 10–12, 1997, pp. 618–619.

S. Bothra et al., "Integration of 0.25 $\mu$m Three and Five Level Interconnect System for High Performance ASIC," VMIC Conference, Jun. 10–12, 1997, pp. 43–48.

Y. Wang et al., "Process Window Characterization of Ultima HDP–CVD™ USG Film," DUMIC Conference, Feb. 10–11, 1997, pp. 405–408, 619.

T. Saikawa et al., "High Density Plasma CVD for 0.3 $\mu$m Device Application," VMIC Conference, Jun. 18–20, 1996, pp. 69–75.

S. Nguyen et al., "Characterization of High Density Plasma Deposited Silicon Oxide Dielectric for 0.25 Micro ULSI," VMIC Conference, Jun. 27–29, 1995, pp. 69–74.

*Primary Examiner*—Mahshid D. Saadat
*Assistant Examiner*—S. V. Clark

[57] ABSTRACT

Spin-on HSQ is employed to gap fill metal layers in manufacturing a high density, multi-metal layer semiconductor device. The degradation of deposited HSQ layers during formation of borderless vias, as from photoresist stripping using an $O_2$-containing plasma, is overcome by treating the degraded HSQ layer with an $H_2$-containing plasma to restore the dangling Si—H bonds, thereby passivating the surface and preventing moisture absorption, before filling the via opening with conductive material, such as a barrier layer.

6 Claims, 3 Drawing Sheets

BORDERLESS VIAS WITH HSQ GAP FILLED PATTERNED METAL LAYERS

TECHNICAL FIELD

The present invention relates to high density, multi-metal layer semiconductor device with reliable interconnection patterns. The invention has particular applicability in manufacturing high density multi-metal layer semiconductor devices with design features of 0.25 microns and under.

BACKGROUND ART

The escalating requirements for high densification and performance associated with ultra large scale integration semiconductor devices require design features of 0.25 microns and under, such as 0.18 microns, increased transistor and circuit speeds, high reliability and increased manufacturing throughput. The reduction of design features to 0.25 microns and under challenges the limitations of conventional interconnection technology, including conventional photolithographic, etching and deposition techniques.

Conventional methodology for forming patterned metal layers comprises a subtractive etching or etch back step as the primary metal patterning technique. Such a method involves the formation of a first dielectric layer on a semiconductor substrate, typically monocrystalline silicon, with conductive contacts formed therein for electrical connection with an active region on the semiconductor substrate, such as a source/drain region. A metal layer, such as aluminum or an aluminum alloy, is deposited on the first dielectric layer, and a photoresist mask is formed on the metal layer having a pattern corresponding to a desired conductive pattern. The metal layer is then etched through the photoresist mask to form the conductive pattern comprising metal features separated by gaps, such as a plurality of metal lines with interwiring spacings therebetween. A dielectric layer is then applied to the resulting conductive pattern to fill in the gaps and the surface is planarized, as by conventional etching or chemical mechanical polishing (CMP) planarization techniques.

As shown in FIGS. 1 and 2, conventional practices comprise depositing metal layer 11 on dielectric layer 10 which is typically formed on a semiconductor substrate containing an active region with transistors (not shown). After photolithography, etching is then conducted to form a patterned metal layer comprising metal features 11a, 11b, 11c and lid with gaps therebetween. A dielectric material 12, such as spin on glass (SOG), is typically deposited to fill in the gaps between the metal features, and baked at a temperature of about 300° C. to about 350° C., and then cured in a verticle furnace at about 350° C. to about 400° C. for a period of time up to about one hour, depending upon the particular SOG material employed, to effect planarization. Another oxide is deposited by plasma enhanced chemical vapor deposition (PECVD) and then planarization is then performed, as by CMP.

As feature sizes, e.g., metal lines and interwiring spacings, shrink to 0.2 microns and below, it becomes increasingly difficult to satisfactorily fill in the interwiring spacings voidlessly and obtain adequate step coverage. It also becomes increasingly difficult to form a reliable interconnection structure. A spin on dielectric material for gap filling appears to be the only viable solution. A through-hole is then formed in a dielectric layer to expose an underlying metal feature, wherein the metal feature serves as a landing pad occupying the entire bottom of the through-hole. Upon filling the through-hole with conductive material, such as a metal plug to form a conductive via, the entire bottom surface of the conductive via is in direct contact with the metal feature. Such a conventional technique is illustrated in FIG. 3, wherein metal feature 30 of a first patterned metal layer is formed on first dielectric layer 31 and exposed by through-hole 32 formed in second dielectric layer 33. In accordance with conventional practices, through-hole 32 is formed so that metal feature 30 encloses the entire bottom opening, thereby serving as a landing pad for metal plug 34 which fills through-hole 32 to form conductive via 35. Thus, the entire bottom surface of conductive via 35 is in direct contact with metal feature 30. Conductive via 35 electrically connects metal feature 30 and metal feature 36 which is part of a second patterned metal layer. As shown in FIGS. 2 and 3, the side edges of a metal feature or conductive line, e.g., 30A, 30B, and 36A, and 36B, taper somewhat as a result of etching.

The reduction of design features to the range of 0.25 microns and under requires extremely high densification. The conventional practice of forming a landing pad completely enclosing the bottom surface of a conductive via utilizes a significant amount of precious real estate on a semiconductor chip which is antithetic to escalating high densification requirements. In addition, it is extremely difficult to voidlessly fill through-holes having such reduced dimensions because of the extremely high aspect ratio, i.e., height of the through-hole with respect to diameter of the through-hole. Accordingly, conventional remedial techniques comprise purposely widening the diameter of the through-hole to decrease the aspect ratio. As a result, misalignment occurs wherein the bottom surface of the conductive via is not completely enclosed by the underlying metal feature. This type of via is called a "borderless via", which also conserves chip real estate.

The use of borderless vias, however, creates new problems. For example, as a result of misalignment, the SOG gap filling layer is penetrated by etching when forming a misaligned through-hole, due to the low density and poor stability of SOG. As a result of such penetration, moisture and gas accumulate thereby increasing the resistance of the interconnection. Moreover, spiking can occur, i.e., penetration of the metal plug to the substrate causing a short. Adverting to FIG. 4, first dielectric layer 41 is formed on substrate 40 and a first metal pattern comprising a first metal feature, e.g., metal line 45, comprising anti-reflective coating 45A, is formed on first dielectric layer 41 gap filled with SOG 42. Dielectric layer 43 is then deposited and a misaligned through-hole formed therein exposing a portion of the upper surface and at least a portion of a side surface of metal line 45, and penetrating into and exposing a portion of SOG layer 42. Upon filling the through-hole with a metallic plug 44, typically comprising an initial barrier layer (not shown) and tungsten, spiking occurs, i.e., penetration through to substrate 40, thereby causing shorting.

In accordance with the present invention, SOG is replaced by hydrogen silsesquioxane (HSQ), which offers many advantages for use in interconnect patterns. HSQ is relatively carbon free, thereby avoiding poison via problems. Moreover, due to the virtual absence of carbon, it is not necessary to etch back HSQ below the upper surface of the metal lines to avoid shorting. In addition, HSQ exhibits excellent planarity and is capable of gap filling interwiring spacings less than 0.15 microns employing conventional spin-on equipment. HSQ undergoes a melting phase at approximately 200° C., but does not convert to the high dielectric constant glass phase until reaching temperatures of about 400° C. for intermetal applications and about 700° C.

to about 800° C. for premetal applications. In copending application Ser. No. 08/992,430, filed on Dec. 18, 1997 (Our Docket No. 1033-365), a method is disclosed for selectively heating portions of a deposited HSQ layer adjoining a metal feature to increase the resistance of such adjoining portions to penetration when etching a misaligned through-hole for a borderless via.

However, HSQ is susceptible to degradation during processing leading to various problems, such as voids when forming borderless vias. For example, when forming a borderless via, a photoresist mask is deposited and the misaligned through-hole etched to expose a portion of an upper surface and a portion of a side surface of a metal line, and penetrate into and expose the HSQ layer. The photoresist mask is then stripped, typically employing an oxygen ($O_2$)-containing plasma. During experimentation assessing the feasibility of employing HSQ for gap filling in interconnection patterns comprising a borderless via, it was found that the $O_2$-containing plasma employed to strip the photoresist mask degraded the HSQ layer. Upon subsequent filling of the misaligned through-hole, as with a barrier material, such as titanium nitride or titanium-titanium nitride, spiking occurred, i.e., the barrier material penetrated through the HSQ layer to the substrate or underlying conductive feature.

HSQ typically contains between about 70% and about 90% Si—H bonds. However, upon exposure to an $O_2$-containing plasma, a considerable number of Si—H bonds are broken and Si—OH bonds are formed. Upon treatment with an $O_2$-containing plasma, as much as about 20% to about 30% of the Si—H bonds in the deposited HSQ film remained. In addition, it was found that exposure to an $O_2$-containing plasma increased the moisture content of the as deposited HSQ film and its propensity to absorb moisture. An HSQ film having reduced Si—H bonds and high Si—OH bonds tends to absorb moisture from the ambient, which moisture outgases during subsequent barrier metal deposition. Thus, it was found that during subsequent barrier and metal deposition, e.g., titanium-titanium nitride and tungsten, outgasing occurred thereby creating voids leading to incomplete electrical connection.

In view of the manifest advantages of HSQ, there exists a need to provide technology whereby HSQ can be employed for voidless gap filling in forming interconnection patterns containing borderless vias.

DISCLOSURE OF THE INVENTION

An object of the present invention is a method of manufacturing a high density multi-metal layer semiconductor device with design features of 0.25 microns and under, and an interconnection pattern comprising high integrity borderless vias.

Another object of the present invention is a high density multi-metal layer semiconductor device with design features of 0.25 microns and under, comprising an interconnection pattern comprising high integrity borderless vias.

Additional objects, advantages and other features of the present invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device comprising: depositing a dielectric layer comprising hydrogen silsesquioxane (HSQ) containing Si—H bonds; and treating the deposited HSQ layer with a $H_2$-containing plasma to increase the number of Si—H bonds.

Another aspect of the present invention is a semiconductor device comprising an interconnection pattern having: an opening filled with conductive material forming an electrical connection between a first lower metal feature and a second upper metal feature; and a layer of hydrogen silsesquioxane (HSQ) adjoining the first metal feature and conductive material; wherein the layer of HSQ comprises more than about 70% Si—H bonds.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

Figure 1:
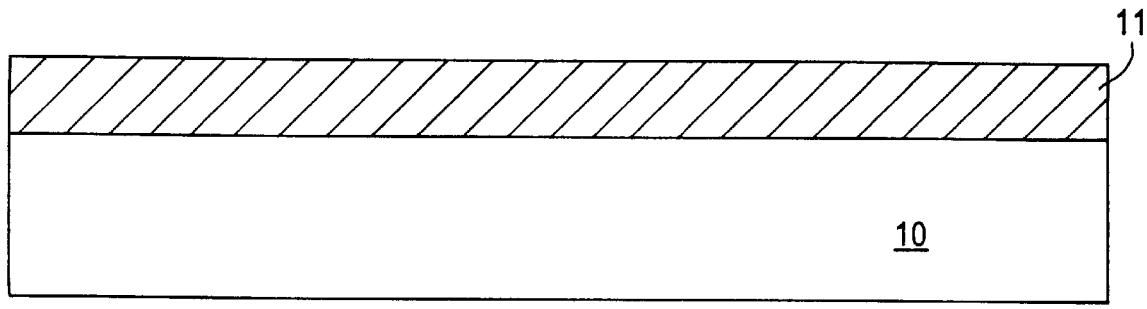
FIGS. 1 and 2 schematically illustrate conventional gap filling a patterned metal layer.
Figure 2:
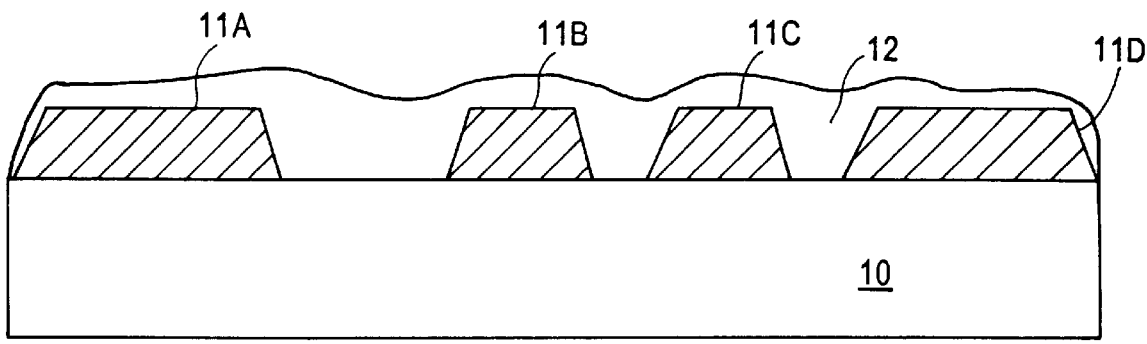
Figure 3:
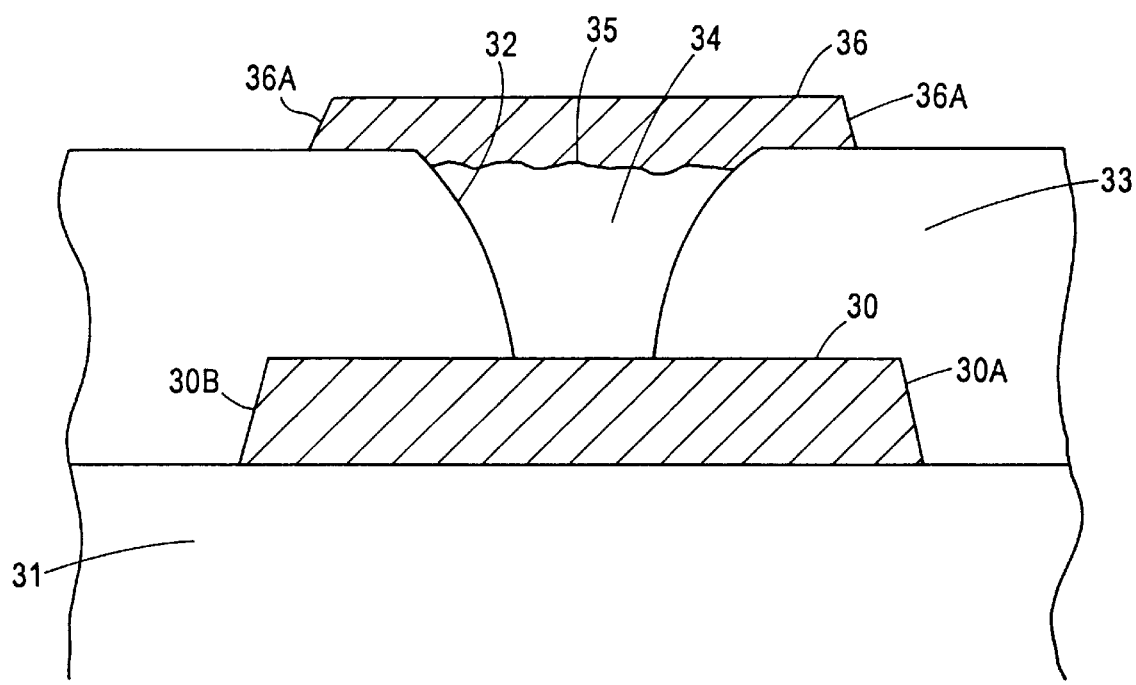
FIG. 3 schematically illustrates a conventional metal plug via interconnection.
Figure 4:
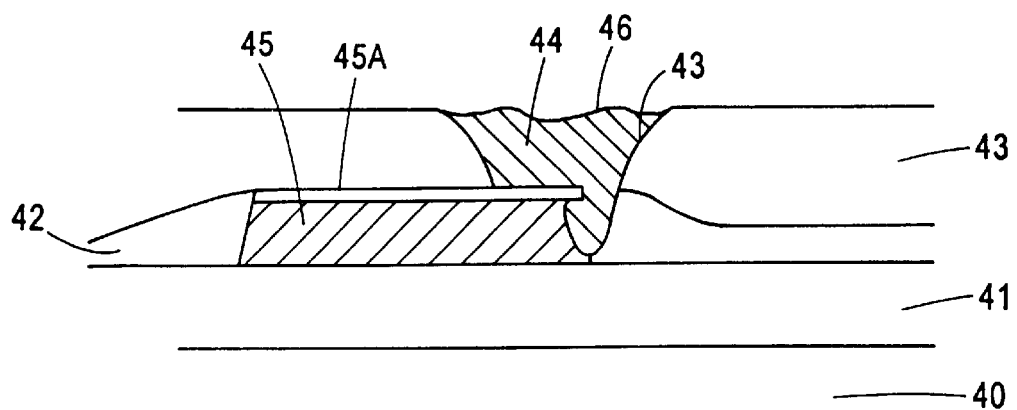
FIG. 4 schematically illustrates spiking in a borderless via.

The present invention enables the effective use of highly reliable borderless vias in forming high density, multi-metal layer semiconductor devices having design features of 0.25 microns and under, employing HSQ to fill gaps in patterned metal layers without incurring adverse consequences stemming from degradation of the HSQ layer. For example, deposited HSQ undergoes degradation upon exposure to an $O_2$-containing plasma during resist stripping prior to filling a through-hole with a composite plug comprising an initial barrier material, such as titanium-titanium nitride or titanium nitride.

HSQ is a highly desirable dielectric material for gap filling, in that it exhibits excellent planarity and gap filling capacity employing conventional spin-on equipment. HSQ can easily fill gaps, e.g., interwiring spacings, less than about 0.15 microns. Moreover, due to the use of a carbon-free polymer precursor, poison via problems are not encountered, and HSQ need not be etched back below the upper surface of the metal line. One form of HSQ is commercially available from Dow Corning Corp. under the product name Flowable Oxide™ or $FO_x$™.

HSQ contains primarily Si—H bonds, e.g., between about 70% to about 90% Si—H bonds. However, HSQ is vulnerable to degradation during processing, whereby the number of Si—H bonds is significantly decreased. For example, exposure to an $O_2$-containing plasma during photoresist stripping can cause a reduction in the number of Si—H bonds of HSQ by about 20% to about 30%, with an increase in the number of Si—OH bonds. As a result, such degraded HSQ exhibits a propensity to pick up moisture from the ambient. During subsequent filling of a through-hole to form a borderless via, as when sputter depositing a titanium-titanium nitride barrier layer in a conventional HI-VAC sputter chamber, such absorbed moisture is outgassed, thereby creating voids and reducing device reliability. Outgasing also occurs when depositing titanium nitride by chemical vapor deposition as, for example, by the method disclosed in copending application Ser. No. 08/934,131, filed on Jun. 5, 1997 (Our Docket No. 1033-350).

In accordance with the present invention, the degradation of as deposited HSQ, as from exposure to an $O_2$-containing plasma, is substantially reversed, i.e., the degraded HSQ is substantially restored to its as deposited condition, by treatment with an $H_2$-containing plasma. It was found that treatment of degraded HSQ with an $H_2$-containing plasma as, for example, an $H_2/N_2$-containing plasma, the number of Si—H bonds is substantially increased, above about 70%, such as above about 80%, e.g., between about 87% and about 90%. It was also found that treatment of degraded HSQ in $H_2/N_2$-containing plasma resulted in the substantial restoration of the Si—H bonds broken or reduced during exposure to an $O_2$-containing plasma. It was further found that treatment of degraded HSQ with an $H_2/N_2$ plasma substantially reduces the Si—OH bonds generated by exposure to an $O_2$-containing plasma. Having been substantially restored to its as-deposited condition, the HSQ treated with an $H_2$-containing plasma in accordance with the present invention does not exhibit a significant propensity to absorb moisture from the ambient.

Thus, in accordance with the present invention, a degraded HSQ gap filled layer is substantially restored to its original Si—H bond content and is no longer prone to absorb significant moisture from the ambient. Accordingly, outgasing and voids do not occur upon subsequent filling a through-hole with conductive material.

$H_2/N_2$ plasma treatment has previously been employed for treating a titanium nitride film deposited by chemical vapor deposition (CVD) to decrease its carbon content. See, for example, copending application Ser. No. 08/934,131 filed on Jun. 5, 1997 (Our Docket No. 1033-350). See, also, A. J. Konecni et al., "A STABLE PLASMA TREATED CVD TITANIUM NITRIDE FILM FOR BARRIER/GLUE LAYER APPLICATIONS," pp. 181–183, Jun. 18–20, 1996, VMIC Conference, 1996 ISMIC; Kim et al., "Stability of TiN Films Prepared by Chemical Vapor Deposition Using Tetrakis-dimethylamino Titanium," J. Electrochem. Soc., Vol. 143, No. 9, September 1996, pp. L188–L190; and J. Iacoponi et al., "RESISTIVITY ENHANCEMENT OF CVD TiN WITH IN-SITU NITROGEN PLASMA AND ITS APPLICATION IN LOW RESISTANCE MULTILEVEL INTERCONNECTS," Advanced Metalization and Interconnection Systems for ULSI Applications in 1995.

In conducting the $H_2$-containing plasma treatment in accordance with the present invention, one having ordinary skill in the art can easily optimize the relevant parameters to achieve the disclosed objective of increasing the number of Si—H bonds and decreasing the number of generated Si—OH bonds of the deposited HSQ film. It has been found, for example, that the parameters and conditions employed in treating a CVD titanium nitride film to reduce its carbon content and resistivity are effective for treating degraded HSQ to increase the number of Si—H bonds and reduce the number of generated Si—OH bonds. Accordingly, the parameters disclosed in copending application Ser. No. 08/934,131 filed Jun. 5, 1997 (Our Docket No. 1033-350), as well as those disclosed in the previously mentioned Konecni et al., Kim et al. and Iacoponi et al. publications, can be employed in the present invention. In treating a degraded HSQ layer with a $H_2/N_2$ plasma in accordance with the present invention, it has been found suitable to employ a hydrogen flow of about 300 sccm, a nitrogen flow of about 200 sccm, a temperature of about 450° C., a pressure of about 1.3 Torr., a RF power of about 750 W and a time of about 25 to about 45 seconds, depending on the thickness of the HSQ film.

A method of forming a borderless via in accordance with an embodiment of the present invention comprises forming a first dielectric layer on a semiconductor substrate and patterning a first metal layer on the first dielectric layer to form metal features separated by gaps, such as metal lines separated by interwiring spacings. The gaps are then filled by depositing HSQ, as by spinning using conventional spinning equipment employed for SOG, at an appropriate temperature, e.g., about 200° C. HSQ is easily capable of completely voidlessly filling gaps even under 0.15 microns. A second dielectric layer is then deposited on the first patterned metal layer and HSQ layer. A misaligned through-hole is then formed in the second dielectric layer and partially penetrating into the HSQ layer exposing a portion of the upper surface and at least a portion of a side surface of the first metal layer and a portion of the HSQ layer.

The through-hole is formed by depositing a photoresist mask on the second dielectric layer and etching through the photoresist mask and a portion of the HSQ layer. The photoresist mask is removed in a conventional manner, employing an $O_2$-containing plasma, whereby the HSQ layer is degraded. The degraded HSQ layer comprises significantly less Si—H bonds and significantly more Si—OH bonds than the undegraded, as deposited HSQ layer. In addition, upon exposure to an $O_2$-containing plasma, the degraded HSQ film exhibits an increased moisture content and continues to increase in moisture content by absorbing moisture from the ambient.

After stripping the photoresist mask with an $O_2$-containing plasma, the degraded HSQ layer is treated with a $H_2/N_2$-containing plasma, whereby the number of Si—H bonds is significantly increased and the number of Si—OH bonds significantly decreased. In addition, the HSQ undergoes a reduction in moisture content during treatment with an $H_2$-containing plasma and the treated HSQ does not exhibit a significant propensity to absorb moisture. Having substantially restored the HSQ layer by reversing the degradation caused by exposure to the $O_2$-containing plasma, the misaligned through-hole is then filled with a conductive material, e.g., a composite plug. Initially, a barrier layer of titanium, titanium-nitride, titanium-tungsten or titanium-titanium nitride is deposited which serves as an adhesion promoter for subsequently deposited tungsten which constitutes the primary plug material. The barrier material, e.g., titanium-titanium nitride, can be sputter deposited employing conventional sputtering equipment.

In another embodiment of the present invention, a CVD-TiN barrier layer is deposited in accordance with the methodology disclosed in copending application Ser. No. 08/934, 131,filed Jun. 5, 1997 (Our Docket No. 1033-350). An advantage of this embodiment is that the $H_2/N_2$ plasma treatment of the HSQ film and the $H_2/N_2$ plasma treatment of the deposited CVD-TiN film can be conducted in the same chamber.

Figure 5:
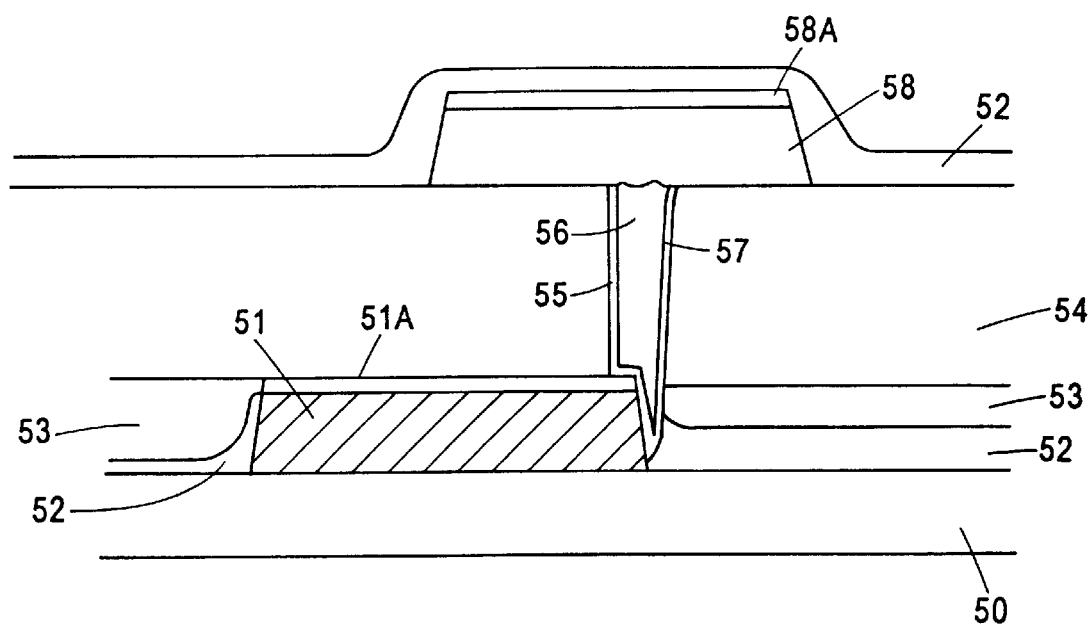
FIG. 5 schematically illustrates a borderless via formed according to the present invention.

An embodiment of the present invention is schematically illustrated in FIG. 5, wherein metal feature 51 of a patterned metal layer is formed on dielectric layer 50, with anti-reflective coating 51 thereon. Gaps between metal features are filled with HSQ 52. An oxide 53, typically an oxide derived from TEOS (tetraethyl orthosilicate), is then deposited and CMP performed. Second dielectric layer 54 is then deposited and a photoresist mask formed thereon. Etching is then conducted to form misaligned through-hole 55 penetrating HSQ layer 52 and exposing a portion of a side surface of metal feature 51. After formation of through-hole 55, the photoresist mask employed is stripped in a conventional manner as with an $O_2$-containing plasma, thereby degrading HSQ layer 52. Degradation is typically characterized by a reduction in a number of Si—H bonds, formation of a significant number of Si—OH bonds and an undesirable propensity to absorb moisture, whereby voids are generated by outgassing upon filling the through-hole with conductive material.

In accordance with the present invention, the degraded HSQ layer is exposed to an $H_2$-containing plasma, thereby restoring the degraded HSQ layer by significantly increasing the number of Si—H bonds and significantly reducing the number of Si—OH bonds. In addition, the restored HSQ is less susceptible to a moisture pick up from the ambient. Through-hole 55 is then filled with a composite plug, as by initially depositing a barrier layer 57 which serves as an adhesion promoter for tungsten 56. The barrier layer is typically a refractory metal, such as titanium, titanium-nitride, titanium-tungsten or titanium-titanium nitride.

After forming conductive via 57, a second patterned metal layer is formed on second dielectric layer 54 and comprises metal feature 58, with anti-reflective coating 58A thereon, electrically connected to metal feature 51 through conductive via 57. The methodology is then repeated by gap filling the second patterned metal layer employing HSQ and carrying out the $H_2$-containing plasma treatment until a desired number of patterned metal layers are formed and gap filled, e.g., five metal layers.

The metal layers employed in the present invention are consistent with the conventional practices and typically, comprise aluminum or an aluminum alloy. Embodiments of the present invention include forming a composite patterned metal layer comprising an initial refractory metal layer, such as tungsten, titanium or titanium nitride, an intermediate aluminum or aluminum alloy layer and an upper anti-reflective coating, such as titanium-titanium nitride. In accordance with the present invention, tungsten is deposited by conventional CVD technology.

The present invention is applicable to the production of various types of semiconductive devices, particularly high density multi-metal patterned layers with submicron features, particularly submicron features of 0.25 microns and below, exhibiting high speed characteristics and improved reliability. The present invention enables the advantageous use of HSQ to gap fill patterned metal layers without the adverse consequences of process induced degradation, as from exposure to an $O_2$-containing plasma. Thus, the present invention solves the problem of void formation in HSQ during borderless via formation. The present invention is cost effective and can easily be integrated into conventional processing and equipment.

In carrying out the embodiments of the present invention, the metal layers can be formed of any metal typically employed in manufacturing semiconductor devices, such as aluminum, aluminum alloys, copper, copper alloys, gold, gold alloys, silver, silver alloys, refractory metals, refractory metal alloys, and refractory metal compounds. The metal layers of the present invention can be formed by any technique conventionally employed in the manufacture of semiconductor devices. For example, the metal layers can be formed by conventional metallization techniques, such as physical vapor deposition (PVD) or chemical vapor deposition (CVD), and electroplating, e.g., copper and copper alloys.

In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail in order not to unnecessarily obscure the present invention.

Only the preferred embodiment of the invention and an example of its versatility are shown and described in the present disclosure. It is to be understood that the invention is capable of use in various other combinations and environments and is capable of changes or modifications within the scope of the inventive concept as expressed herein.

What is claimed is:

1. A semiconductor device comprising an interconnection pattern having:

an opening filled with conductive material forming an electrical connection between a first lower metal feature and a second upper metal feature; and a layer of hydrogen silsesquioxane (HSQ) adjoining the first metal feature and conductive material; wherein the layer of HSQ comprises more than about 70% Si—H bonds.

2. The semiconductor device according to claim 1, wherein the layer of HSQ comprises more than about 80% Si—H bonds.

3. The semiconductor device according to claim 2, wherein the layer of HSQ comprises about 87% to about 90% Si—H bonds.

4. The semiconductor device according to claim 1, comprising:

a first dielectric layer on a semiconductor substrate;

a first patterned metal layer having gaps formed on the first dielectric layer, the first patterned metal layer comprising the first lower metal feature having an upper surface and side surfaces;

a layer of HSQ filling the gaps;

a second dielectric layer formed on the first patterned metal layer and on the HSQ layer;

a through-hole formed in the second dielectric layer exposing a portion of the upper surface and at least a portion of a side surface of the first lower metal feature, and penetrating into and exposing a portion of the HSQ layer; and conductive material filling the through-hole to form a borderless via; wherein, the through-hole is formed by:
        depositing a photoresist mask on the second dielectric layer;
        etching; and
        removing the photoresist mask using an $O_2$-containing plasma causing a reduction in the number of Si—H bonds of the HSQ layer and, wherein, the HSQ layer is subsequently treated with a $H_2$-containing plasma to increase the number of Si—H bonds before filling the through-hole with the conductive material.

5. The semiconductor device according to claim 4, wherein the conductive material is a composition comprising a first conductive barrier layer which acts as an adhesion promoter for a second conductive layer.

6. The semiconductor device according to claim 5, wherein the first conductive layer comprises titanium, titanium-nitride, titanium-tungsten, ortitanium-titanium nitride, and the second conductive layer comprises aluminum or an aluminum alloy.

* * * * *

UNITED STATES PATENT AND TRADEMARK OFFICE
CERTIFICATE OF CORRECTION

PATENT NO. : 5,866,945
DATED : February 2, 1999
INVENTOR(S) : Robert C. Chen

It is certified that error appears in the above-identified patent and that said Letters Patent is hereby corrected as shown below:

Claim 6, Line 62, change "ortitanium" to --or titanium--

Signed and Sealed this

Twenty-fifth Day of May, 1999

Attest:

Attesting Officer

Q. TODD DICKINSON

Acting Commissioner of Patents and Trademarks